(12) United States Patent
Sakano et al.

(10) Patent No.: US 11,326,273 B2
(45) Date of Patent: May 10, 2022

(54) DEVICE AND METHOD FOR PRODUCING TUBULAR SINGLE CRYSTAL

(71) Applicant: KYOCERA Corporation, Kyoto (JP)

(72) Inventors: Ichiro Sakano, Nagano (JP); Masatoshi Harada, Okaya (JP); Akeo Fukui, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/059,048

(22) PCT Filed: May 28, 2019

(86) PCT No.: PCT/JP2019/021037
§ 371 (c)(1),
(2) Date: Nov. 25, 2020

(87) PCT Pub. No.: WO2019/230701
PCT Pub. Date: Dec. 5, 2019

(65) Prior Publication Data
US 2021/0214855 A1 Jul. 15, 2021

(30) Foreign Application Priority Data

May 31, 2018 (JP) .............................. JP2018-104454

(51) Int. Cl.
*C30B 15/34* (2006.01)
*C30B 29/20* (2006.01)
*C30B 29/66* (2006.01)

(52) U.S. Cl.
CPC .............. *C30B 15/34* (2013.01); *C30B 29/20* (2013.01); *C30B 29/66* (2013.01)

(58) Field of Classification Search
CPC ......... C30B 29/20; C30B 29/66; C30B 15/34; Y10T 117/104; Y10T 117/1036
See application file for complete search history.

(56) References Cited

U.S. PATENT DOCUMENTS

| | | | | | |
|---|---|---|---|---|---|
| 3,801,309 | A | * | 4/1974 | Mlavsky | ................. C30B 15/34 23/301 |
| 4,325,917 | A | * | 4/1982 | Pelts | ....................... C30B 29/66 117/950 |
| 4,333,757 | A | * | 6/1982 | Kurtzman, Jr. | ........... C05B 3/00 71/901 |

(Continued)

FOREIGN PATENT DOCUMENTS

| | | |
|---|---|---|
| CN | 85103282 A | 10/1986 |
| CN | 104088011 A | 10/2014 |
| JP | 2016-47792 A | 4/2016 |

*Primary Examiner* — Robert M Kunemund
(74) *Attorney, Agent, or Firm* — Procopio Cory Hargreaves and Savitch LLP

(57) ABSTRACT

A device for producing a tubular single crystal comprises a crucible, a heating means, a die disposed in the crucible, having an annular slit, and a pulling-up means. The upper surface of the die includes an upward slope that increases in height from the annular slit to an inner diameter side and an outer diameter side, respectively, progressing away from the annular slit, wherein the maximum height of the slope on the inner diameter side (H1) is greater than the maximum height of the slope on the outer diameter side (H2) and the difference (H1−H2) is 0.1 mm or more and less than 7.5 mm.

6 Claims, 5 Drawing Sheets

(56) References Cited

U.S. PATENT DOCUMENTS

| | | | | | |
|---|---|---|---|---|---|
| 4,334,948 | A | * | 6/1982 | Berkman | ............... C30B 15/34 117/26 |
| 4,711,695 | A | * | 12/1987 | Stormont | ............... C30B 15/34 117/25 |
| 2008/0245292 | A1 | * | 10/2008 | Outwater | ............... C30B 15/34 117/23 |

* cited by examiner

DEVICE AND METHOD FOR PRODUCING TUBULAR SINGLE CRYSTAL

TECHNICAL FIELD

This disclosure relates to a device for producing a tubular single crystal, such as a sapphire single crystal, and a method for producing the tubular single crystal using this device.

BACKGROUND ART

Conventionally, the edge-defined film fed growth method (hereinafter, EFG method) is known as a method for growing a single crystal. This method involves growing the single crystal in a rod, plate (ribbon) or tube shape by heating and melting a raw material of the single crystal filled in a crucible, bringing a seed crystal (seed) into contact with the molten liquid, which rises to the upper surface of a die by capillary action through a slit in the die (mold) installed in the crucible, and pulling the seed crystal upward.

The production of the single crystal by the EFG method is disclosed, for example, in Patent Document 1. Using the EFG method, it is possible to produce the single crystal while maintaining a plane orientation of the seed crystal. Therefore, it has the advantage of obtaining the single crystal having a desired plane orientation, such as a single crystal whose main plane has a desired plane orientation, without complex processing to adjust the plane orientation in the post-process.

The tubular single crystal is grown by making the slit in the die (mold) into an annular shape and pulling up the single crystal in a tubular shape from the annular slit.

However, in growing the tubular single crystal, a temperature difference tends to occur between the inner diameter side and the outer diameter side of the die. This makes it difficult to stably grow the tubular single crystal, causing problems such as the tubular single crystal to bend and the film thickness to become thin.

PRIOR ART DOCUMENTS

Patent Documents

Patent Document 1: Japanese Unexamined Patent Publication No. 2016-47792

SUMMARY OF THE INVENTION

The device for producing a tubular single crystal according to the present disclosure comprises a crucible filled with a raw material of a single crystal, a heating means for melting the raw material in the crucible, a die disposed in the crucible, having an annular slit for sucking up molten liquid in the crucible and retaining the molten liquid on its upper surface, a pulling-up means in which a seed crystal in contact with the molten liquid on the upper surface of the die is attached to the lower end, and a single crystal is grown while pulling up the seed crystal from the molten liquid. The upper surface of the die includes an upward slopes that increase in height from the annular slit to the inner diameter side and the outer diameter side, respectively, as they move away from the annular slit, and the difference (H1–H2) between the maximum height of the slope on the inner diameter side (H1) and the maximum height of the slope on the outer diameter side (H2) is 0.1 mm or more and less than 7.5 mm.

The method for producing a tubular single crystal according to the present disclosure is for growing a tubular single crystal using the EFG method, and includes a step of filling a crucible with a raw material of the single crystal and melting the raw material in the crucible by induction heating with a high-frequency coil surrounding the outer circumference of the crucible to obtain molten liquid, and a step of supplying and retaining the molten liquid to the upper surface of a die through an annular slit formed in the die disposed in the crucible, placing a seed crystal on the molten liquid, and raising the seed crystal vertically from the molten liquid while slowly cooling the molten liquid to grow the tubular single crystal. The upper surface of the die includes an upward slopes that increase in height from the annular slit to the inner diameter side and the outer diameter side, respectively, as they move away from the annular slit, and the difference (H1–H2) between the maximum height of the slope on the inner diameter side (H1) and the maximum height of the slope on the outer diameter side (H2) is 0.1 mm or more and less than 7.5 mm.

EMBODIMENTS FOR CARRYING OUT THE INVENTION

Figure 1:
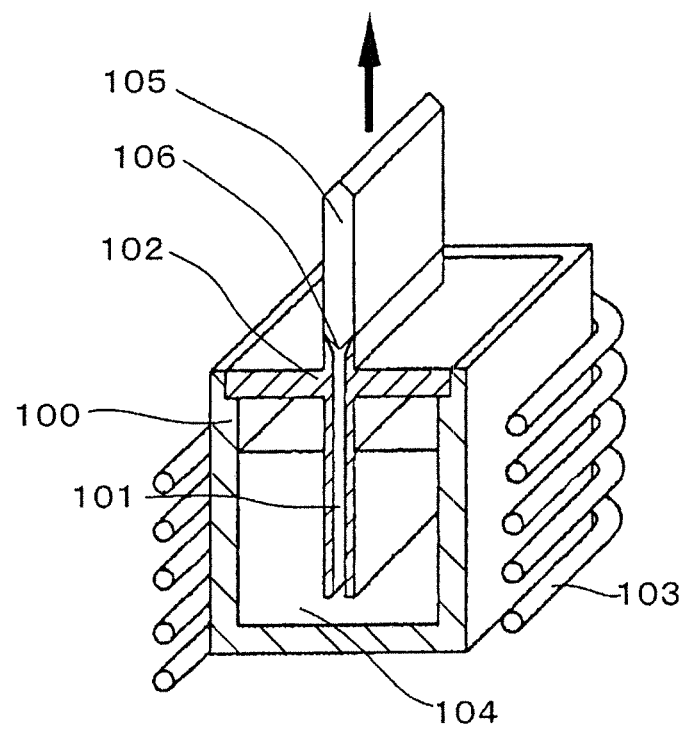
FIG. 1 is a schematic view illustrating the EFG method according to the present disclosure.

In the EFG method, a die (mold) 102 having a slit (gap) 101 is installed in the crucible 100, as shown conceptually in FIG. 1. The raw material of a single crystal 105 filled in a crucible 100 is heated and melted by a heating coil 103 disposed on the outer circumference of the crucible 100. The resulting molten liquid 104 rises through the slit 101 to the upper surface of the die 102 by capillary action. A single crystal 105 is grown by bringing the seed crystal 6, which will be described later, into contact with the liquid surface of the molten liquid 104 and pulling it upward. In FIG. 1, the sign 106 indicates the solid-liquid interface between the molten liquid 104 and the single crystal 105.

Figure 2:
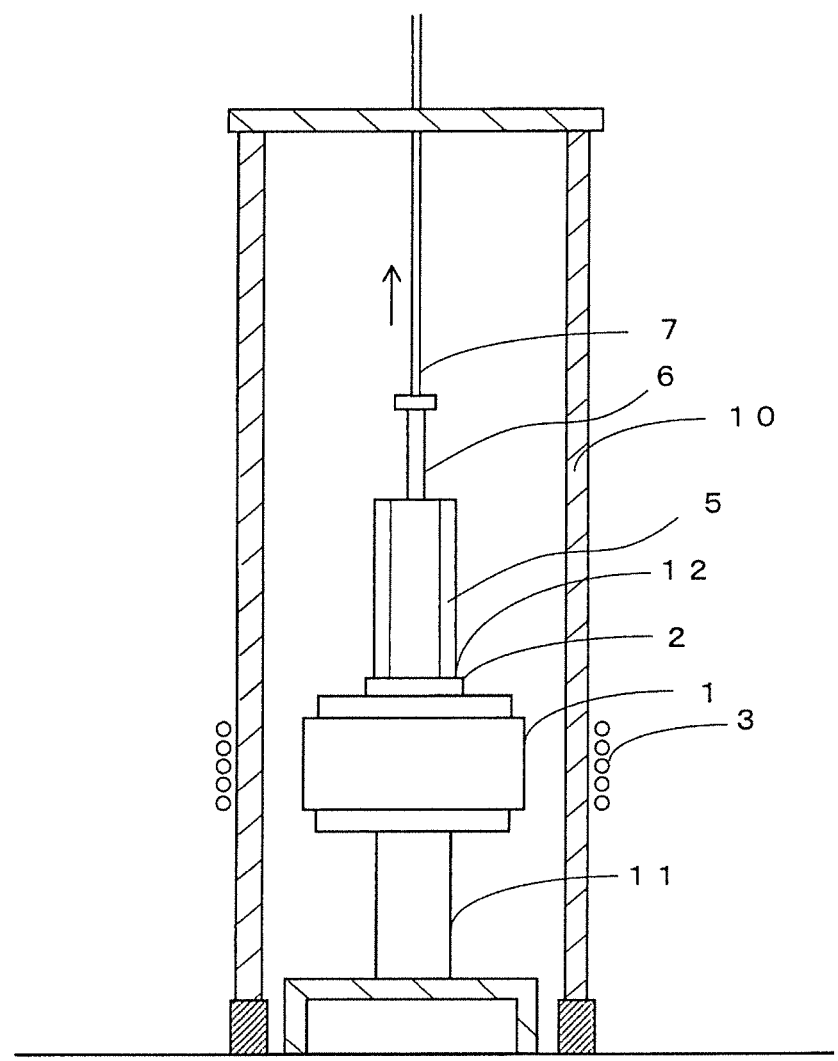
FIG. 2 is a schematic sectional view showing an embodiment of the device for producing the single crystal of the present disclosure.

FIG. 2 shows a device for producing a tubular single crystal 5 according to one embodiment of the present disclosure, and particularly shows a state in which the tubular single crystal 5 is being grown. As shown in FIG. 2, the crucible 1, to which the raw material for the single crystal 5 is supplied, is installed at the bottom of a growth chamber 10 and is held by a stand 11. The growth chamber 10 is a cylindrical container and is made of refractory materials such as Mo, W, and W—Mo alloys, carbon, zirconia ($ZrO_2$), and alumina. The crucible 1 is made of molybdenum (Mo), tungsten (W), tungsten-molybdenum alloy (W—Mo), iridium (Ir) or the like.

The growth chamber 10 is hermetically sealed and is equipped with a gas supply port and a gas outlet, which are not shown. In order to prevent oxidation, an inert gas such as argon gas is supplied from the gas supply port into the growth chamber 10, and the single crystal 5 is grown under an inert gas atmosphere.

A heating coil 3 is spirally wound around the outer circumference of the growth chamber 10 so as to surround the crucible 1. The heating coil 3 is an induction coil in which a high frequency voltage is applied and a high frequency current flows. In other words, when a high frequency current flows through the heating coil 3, a magnetic field is formed around the crucible 1, and an eddy current is generated on the surface of the crucible 1 by this magnetic field, which causes the crucible 1 to heat up.

A die 2 is installed in the crucible 1. An annular slit 12 is formed in the die 2. In the upper part of the die 2, a seed holder 7 which holds a seed crystal (seed) 6 at the lower end is installed. The seed holder 7 is composed of a shaft body, which can be raised and lowered in the vertical direction by a control means not shown, and is capable of rotating around a shaft center. There are no restrictions on the shape of the seed crystal 6, but it has, for example, a plate, rod or tube shape.

Figure 3:
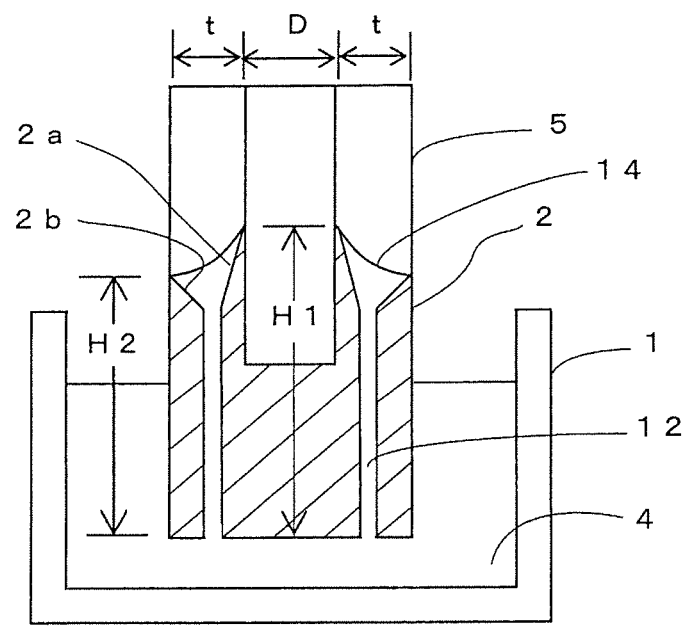
FIG. 3 is a schematic sectional view showing the growth of the tubular single crystal using the die according to the present disclosure.

The raw material of the single crystal 5 filled in the crucible 1 is heated and melted by the heating coil 3. As shown in FIG. 3, the resulting molten liquid 4 rises through the annular slit 12 to the upper surface of the die 2 by capillary action. The lower end of the seed crystal 6 comes into contact with the molten liquid on the upper surface of the die 2 and is pulled upward at a constant rate to obtain the single crystal 5. In FIG. 3, the reference numeral 14 indicates the solid-liquid interface between the molten liquid 4 and the single crystal 5. Although not shown, the inner diameter side and the outer diameter side of the annular slit 12 are partially connected at the bottom of the die 2, for example, so as not to interfere with the rise of the molten liquid 4.

When producing, for example, a sapphire single crystal 5, as the raw material of the single crystal 5, high-purity alumina ($AI_2O_3$, purity of 99.9% or more) is used, and the raw material is heated at a temperature above the melting point of alumina (approximately 2050° C.)

Figure 4:
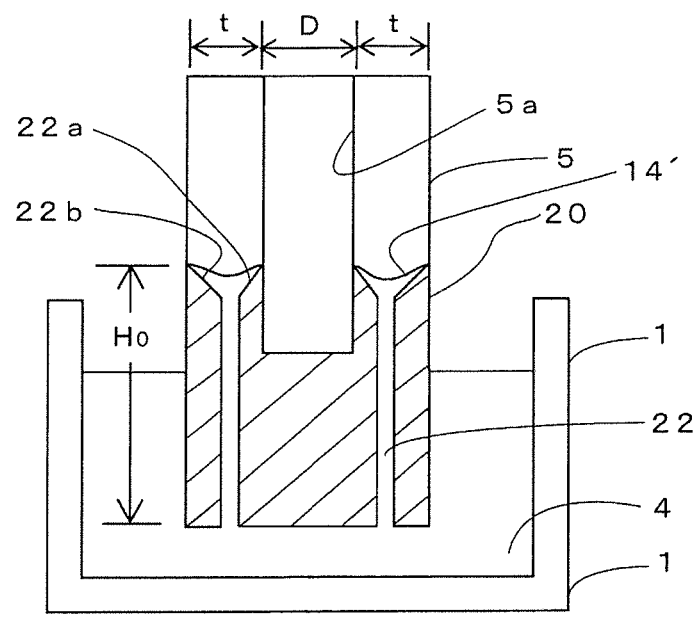
FIG. 4 is a schematic sectional view showing the growth of the tubular single crystal using an ordinary die.

FIG. 4 shows an ordinary die 20 for producing the tubular single crystal 5. This die 20 has an annular slit 22. The upper surface of the die 20 includes upward slopes 22a and 22b that increase in height from the annular slit 22 to the inner diameter side and the outer diameter side, respectively, as they move away from the annular slit 22, and the maximum height $H_0$ of the slope 22a on the inner diameter side and the slope 22b on the outer diameter side are respectively equal. Since the other members of FIG. 4 are the same as in FIG. 3, they are designated by the same reference numerals and the explanation thereof is omitted. In FIG. 4, the reference numeral 14' indicates the solid-liquid interface.

In such an ordinary die 20, especially in the growing of the tubular single crystal 5 with a large diameter, the temperature on the inner diameter side, which is covered by the inner wall 5a of the grown tubular single crystal 5, is higher than the temperature on the outer diameter side. This causes a temperature difference between the inner diameter side and the outer diameter side of the die 20, which makes it difficult to stably grow the tubular single crystal 5. As a result, defects such as bending of the tubular single crystal 5 and thinning of the wall thickness are likely to occur.

On the other hand, the die 2 of the present embodiment shown in FIG. 3 has the annular slit 12 as in FIG. 4, and the upper surface of the die 2 includes upward slopes 2a and 2b that increase in height from the annular slit 12 to the inner diameter side and the outer diameter side, respectively, as they move away from the annular slit 12, as in the ordinary die 20. The maximum height H1 of the slope 2a on the inner diameter side is greater than the maximum height H2 of the slope 2b on the outer diameter side.

By forming the maximum height H1 of the slope 2a on the inner diameter side of the die 2 larger than the maximum height H2 of the slope 2b on the outer diameter side, the temperature of the tip of the slope 2a on the inner diameter side is lowered, and the temperature difference between the tip of the slope 2a on the outer diameter side and the tip of the slope 2b on the outer diameter side is eliminated or reduced. This allows the stable tubular single crystal 5 to be grown. In other words, bending of the tubular single crystal 5 and thinning of the wall thickness are suppressed, and the thickness accuracy of the resulting tubular single crystal 5 is improved.

The difference (H1−H2) between the maximum height of the slope 2a on the inner diameter side (H1) and the maximum height of the slope 2b on the outer diameter side (H2) may be 0.1 mm or more and less than 7.5 mm, and the upper limit may preferably be 5.0 mm or less.

The inner diameter D of the tubular single crystal 5 may be 0.4 mm or more and 50 mm or less, preferably 2 mm or more and 20 mm or less.

A thickness t of the tubular single crystal 5 may be 0.2 mm or more and 25 mm or less, preferably 0.5 mm or more and 5 mm or less. The thickness t of the tubular single crystal 5 is approximately equal to the width from the maximum height (H1) part of the slope 2a on the inner diameter side to the maximum height (H2) part of the slope 2b on the outer diameter side.

Figure 5A:
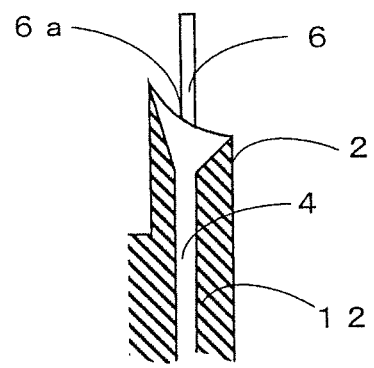
FIG. 5($a$) and FIG. 5($b$) are diagrams illustrating a method for pulling up the single crystal according to the present disclosure.
Figure 5B:
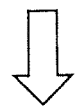
Figure 5B:
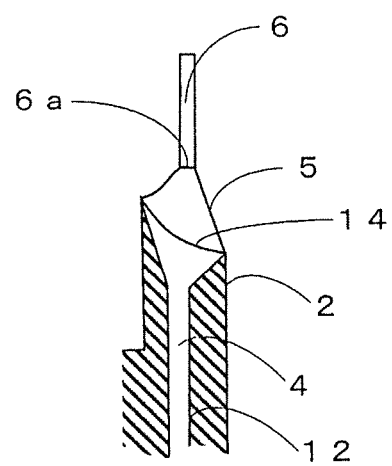

FIGS. 5(a) and (b) are partial sectional views of the annular slit 12. To produce the tubular single crystal 5 of the present embodiment, as shown in FIG. 5(a), the molten liquid 4 is supplied and retained on the upper surface of the die 2 via the annular slit 12, and the tip 6a of the seed crystal 6 is disposed and contacted with at least the liquid surface of the molten liquid 4. From this state, the seed holder 7 holding the seed crystal 6 at the lower end is raised, and the seed crystal 6 is raised vertically from the molten liquid 4 at a constant rate and slowly cooled down while growing the tubular single crystal 5, as shown in FIG. 5(b).

The molten liquid 4 supplied to the upper surface of the die 2 by the annular slit 12 is held in an annular shape. The seed crystal 6 is formed in a plate or rod shape. As shown in FIG. 5(a), the seed crystal 6 is brought in contact with at least one point of the annularly held molten liquid 4 and pulled upward in that state, resulting in the tubular single crystal 5 as shown in FIG. 5(b). FIG. 5(b) shows the state immediately after pulling up. When the seed crystal 6 is pulled further upward from the state in FIG. 5(b), the tubular single crystal 5 having the thickness t that is approximately equal to the width from the maximum height (H1) part of the slope 2a on the inner diameter side to the maximum height (H2) part of the slope 2b on the outer diameter side is obtained, as shown in FIG. 3.

If necessary, the plate or rod-shaped seed crystal 6 may be brought in contact with the annularly held molten liquid 4 at two or more points and pulled up at the same time. Furthermore, the seed crystal 6 may be formed in the same annular shape as the molten liquid 4 and contacted and pulled up with the liquid surface of the molten liquid 4 all around.

There may be not only one die 2 having the annular slit 12 to the crucible 1, but a plurality of dies 2 may be installed. A plurality of annular slits 12 may be juxtaposed on one die 2. In these cases, production efficiency is improved by holding a corresponding number of seed crystals 6 at the lower end of the seed holders 7, respectively, and pulling them up at the same time to grow a plurality of tubular monocrystalline bodies 5 simultaneously.

In the EFG method, the single crystal 5 grows with the same plane orientation (crystal orientation) as that of the seed crystal 6. Therefore, it is necessary to precisely adjust the positional relationship between the seed crystal 6 and the die 2, but in the present embodiment, the positional relationship can be adjusted in the same manner as in the conventional case.

According to the device and method for producing the tubular single crystal of the present disclosure, the upper surface of the die 2 includes upward slopes 2a and 2b, whose heights increase from the annular slit 12 to the inner diameter side and the outer diameter side, respectively, as they move away from the annular slit 12, and is composed in a predetermined range in which the height of the slope 2a on the inner diameter side is greater than the height of the slope 2b on the outer diameter side. Therefore, it is possible to stably grow the tubular single crystal 5 and suppress bending and thickness defect. Accordingly, the tubular single crystal 5 of the present disclosure can be suitably used as a plasma generator tube in a semiconductor production equipment (SPE), a protective tube such as a thermocouple, a protective tube such as a sensor in an analysis device, or a container for a sample.

According to the present disclosure, the difference (H1-H2) between the maximum height of the slope on the inner diameter side (H1) and the maximum height of the slope on the outer diameter side (H2) of the annular slit on the upper surface of the die is 0.1 mm or more and less than 7.5 mm, and thus the temperature of the upper surface of the die on the inner diameter side is lowered and the temperature difference with the upper surface of the die on the outer diameter side is eliminated or reduced, thereby enabling stable growth of the tubular single crystal and suppressing bending and thickness defects in the tubular single crystal.

Although the embodiments of the present disclosure have been described above, the present disclosure is not limited to the above-described embodiments, and of course various improvements and modifications may be made within the scope of the claims. The device and method for producing the single crystal of the present disclosure are not limited to the sapphire single crystal 5, but are similarly applicable to the production of monocrystalline bodies 5, such as silicon (Si), gallium oxide ($Ga_2O_3$), and rutile ($TiO_2$).

In the following Example, the device and method for producing the single crystal of the present disclosure will be described in more detail, but the disclosure is not limited to the following Example only. EXAMPLE In the device for producing the single crystal shown FIGS. 2 and 3, it was studied how the difference (H1-H2) between the maximum height of the slope 2a on the inner diameter side (H1) and the maximum height of the slope 2b on the outer diameter side (H2) from the annular slit 12 on the upper surface of the die 2 placed in the crucible 1 affects the growth of tubular sapphire single crystal. That is, the growth state of the tubular sapphire single crystal was visually confirmed, when the difference (H1-H2) was between 0.1 mm to 10.0 mm. Table 1 shows the results.

The growth state was assessed using the following criteria.
○: There is no bending or thickness defect in the tubular single crystal.
x: Either bending or thickness defect is observed in the tubular single crystal.

TABLE 1

| The Difference in the Maximum Height of the Die H1-H2 (mm) | Growth Results |
| --- | --- |
| 0 | x |
| 0.1 | ○ |
| 0.5 | ○ |
| 2.5 | ○ |
| 5.0 | ○ |
| 7.5 | x |
| 10.0 | x |

When the difference in the maximum height of die 2 (H1-H2) was 0 mm, 7.5 mm and 10.0 mm, the temperature difference between the inner diameter side and the outer diameter side of the tubular single crystal became large, causing the tubular single crystal to bend and to have a thickness defect.

At this time, when the above H1-H2 is 0 mm, it is presumed that if the temperature on the inner diameter side is appropriate and the temperature on the outer diameter side is lower than that, bending is likely to occur due to the temperature on the outer diameter side, whereas if the temperature on the outer diameter side is appropriate and the temperature on the inner diameter side is higher than that, the thickness of the tubular single crystal is likely to be reduced due to the temperature on the inner diameter side.

When the above H1-H2 is 7.5 mm and 10.0 mm, it is presumed that bending occurs because the temperature on the inner diameter side is lower than the temperature on the outer diameter side. Furthermore, a defect was observed in which the single crystal adheres to the die and the die is lifted when the temperature on the inner diameter side is lowered.

DESCRIPTION OF THE REFERENCE NUMERALS 1, 100 Crucible
2, 20, 102 Die
3, 103 Heating Coil
4, 104 Molten Liquid
5, 105 Single crystal
6 Seed Crystal
7 Seed Holder
10 Growth Chamber
11 Stand
12, 22 Annular Slit
14, 14', 106 Solid-Liquid Interface
101 Slit

The invention claimed is:
1. A device for producing a tubular single crystal comprising:
a crucible filled with a raw material of a single crystal,
a heating means for melting the raw material in the crucible,
a die disposed in the crucible, having an annular slit for sucking up molten liquid in the crucible and retaining the molten liquid on its upper surface, and
a pulling-up means in which a seed crystal in contact with the molten liquid on the upper surface of the die is attached to the lower end, and a single crystal is grown while pulling up the seed crystal from the molten liquid,
wherein the upper surface of the die comprises an upward slopes that increase in height from the annular slit to the inner diameter side and the outer diameter side, respec- tively, as they move away from the annular slit, and the difference (H1–H2) between the maximum height of the slope on the inner diameter side (H1) and the maximum height of the slope on the outer diameter side (H2) is 0.1 mm or more and less than 7.5 mm.

2. A device for producing a tubular single crystal according to claim 1, wherein the single crystal is a single crystal of sapphire, silicon, gallium oxide, or rutile.

3. A method for producing a tubular single crystal which is grown by the edge-defined film fed growth method comprising:

a step of filling a crucible with a raw material of the single crystal and melting the raw material in the crucible by induction heating with a high-frequency coil surrounding the outer circumference of the crucible to obtain molten liquid, and a step of supplying and retaining the molten liquid to the upper surface of a die through an annular slit formed in the die disposed in the crucible, placing a seed crystal on the molten liquid, and raising the seed crystal vertically from the molten liquid while slowly cooling the molten liquid to grow the tubular single crystal, wherein the upper surface of the die includes an upward slopes that increase in height from the annular slit to the inner diameter side and the outer diameter side, respectively, as they move away from the annular slit, and the difference (H1–H2) between the maximum height of the slope on the inner diameter side (H1) and the maximum height of the slope on the outer diameter side (H2) is 0.1 mm or more and less than 7.5 mm.

4. A method for producing a tubular single crystal according to claim 3, wherein the inner diameter of a tubular single crystal is from 0.4 mm to 50 mm.

5. A method for producing a tubular single crystal according to claim 3, wherein a thickness of a tubular single crystal is from 0.2 mm to 25 mm.

6. A method for producing a tubular single crystal according to claim 3, wherein the plate or rod-shaped seed crystal is brought in contact with at least one place of the molten liquid and pulled upward.

\* \* \* \* \*